United States Patent [19]

Connolly et al.

[11] Patent Number: 4,461,008

[45] Date of Patent: Jul. 17, 1984

[54] TERRACED HETEROSTRUCTURE SEMICONDUCTOR LASER

[75] Inventors: John C. Connolly, Cranbury; Dan Botez, Mount Holly, both of N.J.

[73] Assignee: RCA Corporation, New York, N.Y.

[21] Appl. No.: 367,212

[22] Filed: Apr. 9, 1982

[51] Int. Cl.³ .............................................. H01S 3/19
[52] U.S. Cl. ...................................... 372/45; 357/17; 372/48
[58] Field of Search ....................... 372/44, 45, 46, 48; 357/17

[56] References Cited

U.S. PATENT DOCUMENTS

| | | | |
|---|---|---|---|
| 3,701,047 | 10/1972 | Caplan et al. | 331/94.5 |
| 3,753,801 | 8/1973 | Lockwood et al. | 148/171 |
| 4,092,659 | 5/1978 | Ettenberg | 357/18 |
| 4,178,564 | 12/1979 | Ladany et al. | 331/94.5 |
| 4,215,319 | 7/1980 | Botez | 331/94.5 |
| 4,296,387 | 10/1981 | Sugino et al. | 331/94.5 |
| 4,347,486 | 8/1982 | Botez | 372/46 |

OTHER PUBLICATIONS

D. Botez et al., "Constricted Double-Heterostructure (AlGa)As Diode Lasers," *Applied Physics Letters*, 32(4), Feb. 15, 1978.

G. H. Olsen et al., "Universal Stain/Etchant for Interfaces in III–V Compounds," *Journal of Applied Physics*, vol. 45(11), Nov. 1974.

T. Sugino et al., "Fundamental Transverse and Longitudinal Mode Oscillation in Terraced Substrate GaAs–(GaAl)As Lasers," *IEEE Journal of Quantum Electronics*, vol. QE-15, No. 8, Aug. 1979.

*Primary Examiner*—James W. Davie
*Attorney, Agent, or Firm*—Birgit E. Morris; Donald S. Cohen; William J. Burke

[57] ABSTRACT

A semiconductor laser comprising a substrate with a pair of grooves in the surface thereof and a first confinement layer which overlies the surface of the substrate and has a terrace in its surface. An active layer overlies the surface of the first confinement layer and has a portion of maximum thickness and its recombination region over the concave portion of the terrace in the first confinement layer. A weak asymmetric positive index optical guide is thus formed which supports only the fundamental lateral optical mode.

17 Claims, 6 Drawing Figures

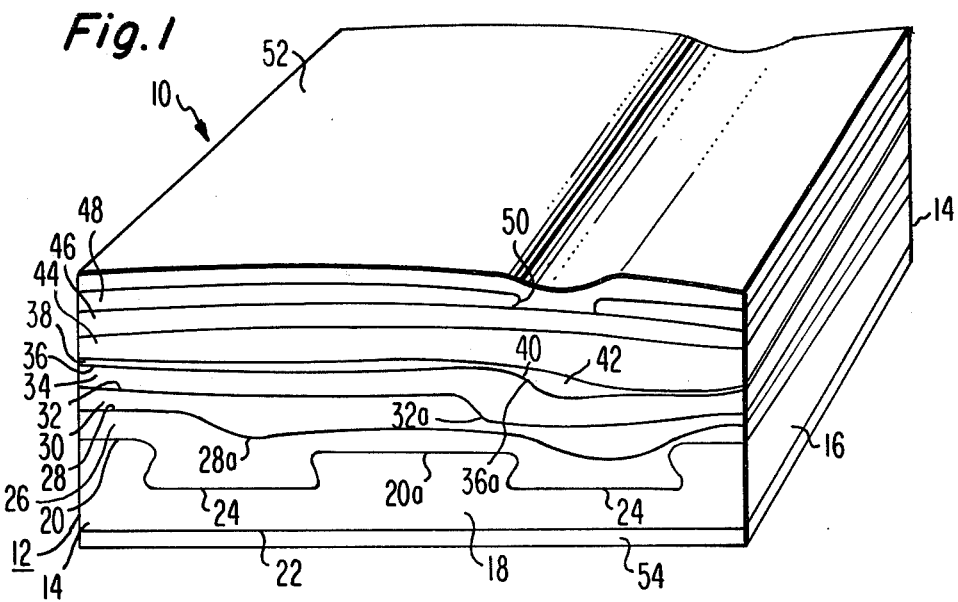
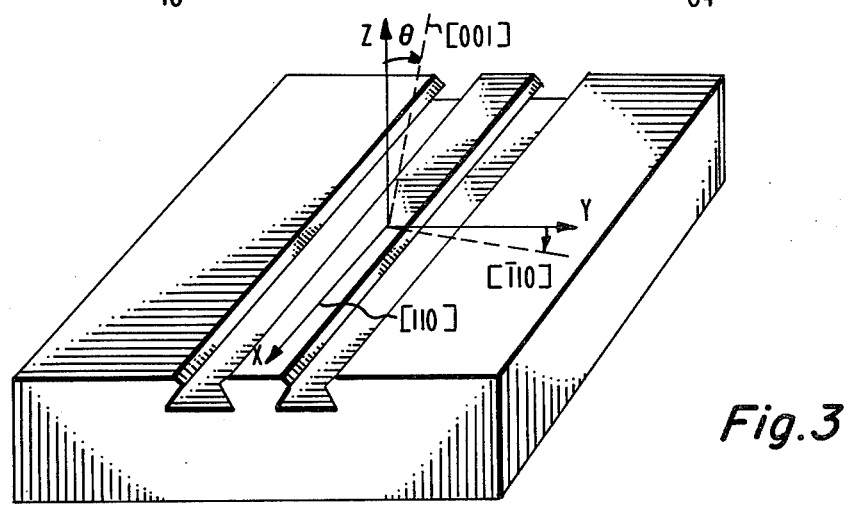

TERRACED HETEROSTRUCTURE SEMICONDUCTOR LASER

The Government has rights in this invention pursuant to a Government Contract.

The invention relates to a semiconductor laser and, in particular, to a semiconductor laser having a high output power in a single optical mode.

BACKGROUND OF THE INVENTION

Botez, in U.S. Pat. No. 4,215,319, incorporated herein by reference, has disclosed a semiconductor laser which includes a substrate having a pair of spaced, substantially parallel grooves in a surface thereof with a mesa therebetween. A first confinement layer overlies the surface of the substrate, the mesa and the surfaces of the grooves, an active layer overlies the first confinement layer and a second confinement layer overlies the active layer. The active layer tapers, either symmetrically or asymmetrically, in increasing or decreasing thickness in the lateral direction, the direction in the plane of the layers perpendicular to the axis of the grooves, depending upon the crystallographic orientation of the substrate surface and the surface curvature of the underlying layers. The active layer over the flat portion of the first confinement layer over the mesa is the recombination region of the laser. Botez, in U.S. Pat. No. 4,347,486 and incorporated herein by reference, has disclosed a semiconductor laser having a guide layer interposed between the first confinement layer and the active of the laser described above. The active above the mesa is the recombination region of the laser and light generated therein propagates in both the active layer and the guide layer. Botez et al., in Applied Physics Letters 32, 261-263 (1978), have disclosed a semiconductor laser comprising a substrate having a dovetail shaped groove in a surface thereof with the first confinement layer, active layer and second confinement layer overlying the surface of the substrate and the groove. The active region has a portion of minimum thickness adjacent to one edge of the groove and tapers in increasing thickness in the lateral direction due to local differences in the growth rates over the groove. The surface of the substrate is misoriented from a {100} plane producing a slight asymmetry in the thickness of the layers. Light is generated in the portion of minimum thickness at the edge of the groove. In each of these laser structures, local variations in the growth rate over curved surfaces produce layers of varying thickness and the resultant semiconductor laser possesses improved lateral optical mode characteristics.

It would be desirable to find other laser structures based upon the variation in local growth rates which further improve the output power capability, optical mode characteristics and stability of the output laser beam.

SUMMARY OF THE INVENTION

We have found that the deposition of the active layer of a semiconductor laser over a terraced confinement layer results in an active layer which has its maximum thickness and recombination region over the concave portion of the terrace and which tapers in decreasing thickness in the lateral direction. A weak, asymmetric positive index optical guide is thus formed which supports only the fundamental lateral optical mode. A guide layer may be interposed between the confinement layer and the active layer with the thickest portion of the active layer over the terrace in the guide layer.

BRIEF DESCRIPTION OF THE DRAWING

FIG. 1 is a perspective view of a semiconductor laser of the invention.

FIG. 2 is a side view of a semiconductor laser of the invention.

FIG. 3 is a schematic illustration of the substrate misorientation.

DETAILED DESCRIPTION OF A PREFERRED EMBODIMENT

Figure 4A:
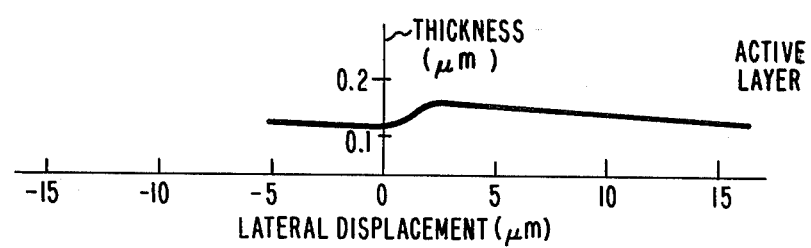
FIG. 4(a) is a graphical illustration of the lateral thickness variation of the active layer of the semiconductor laser.
Figure 4B:
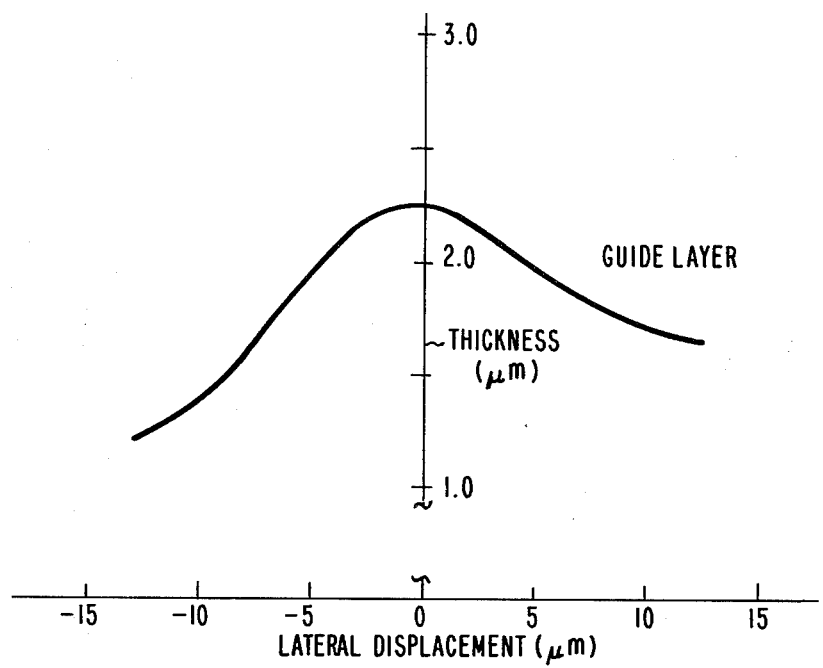
FIG. 4(b) is a graphical illustration of the lateral thickness variation of the guide layer of the semiconductor laser.

In FIG. 1 a semiconductor laser, incorporating the present invention and designated as 10, comprises a body 12 of single-crystal semiconductor material, typically composed of group III–V compounds, in the form of a rectangular parallelopiped. The body 12 has spaced, parallel end faces 14 with one of the end faces 14 being partially transparent so that light may be emitted therefrom. The body 12 also includes spaced, parallel side surfaces 16 which extend between and are perpendicular to the end faces 14.

The semiconductor body 12 includes a substrate 18 having spaced, parallel major surfaces 20 and 22 which extend between and are perpendicular to both the end faces 14 and the side surfaces 16. In the major surface 20 are a pair of spaced, substantially parallel grooves 24 which extend between the end faces 14. The portion of the major surface 20 between the grooves 24 forms a mesa 20a. A buffer layer 26 overlies the major surface 20, the mesa 20a and fills the grooves 24 and has a terraced surface 28 including a concave portion 28a. A first confinement layer 30 overlies the surface 28 and has a terraced surface 32 including a concave portion 32a which is laterally spaced from the concave portion 28a. A guide layer 34 overlies the terraced surface 32 and has a surface 36 with a concave portion 36a which is laterally spaced from the concave portion 32a. An active layer 38 overlies the surface 36 of the guide layer 34, has a shoulder 40 over the thickest portion of the guide layer 34 and a portion of maximum thickness 42 overlying the concave portion 36a of the terraced surface 36. A second confinement layer 44 overlies the active layer 38 and a capping layer 46 overlies the second confinement layer 44. An electrical isolation layer 48 overlies the capping layer 46 and has an opening 50 extending therethrough in the form of a stripe extending between the end faces 14 over the portion of the maximum thickness 42 of the active layer 40. A first electrical contact 52 overlies the electrical isolation layer 48 and the portion of a capping layer 46 in the region of the opening 50. A substrate electrical contact 54 overlies the second major surface 22.

In FIG. 2 a semiconductor laser 10 also includes a protective coating 62 on the end face 14 which is substantially transmissive at the wavelength of the light emitted by the laser 10. A reflector 64 which reflects light at the wavelength emitted by the laser 10 overlies the opposed end face 14.

The substrate 18, the buffer layer 26, the first confinement layer 30 and the guide layer 34 are of one conductivity type, either p- or n-type, and the second confinement layer 44 and the capping layer 46 are of the opposite conductivity type. It is to be understood that the conductivity types of each of these layers may be reversed so long as the relationships of the conductivity types of the various layers are maintained.

The materials which compose the active layer 38 the guide layer 34 and the first and second confinement layers 30 and 44 respectively are so chosen that the bulk index of refraction of the active layer 38 is greater than that of the guide layer 34 which is greater than that of the first and second confinement layers 30 and 44.

The various epitaxial layers may be deposited using well-known techniques of liquid phase epitaxy as described by Botez in U.S. Pat. No. 4,215,319 and by H. F. Lockwood et al., in U.S. Pat. No. 3,753,801, incorporated herein by reference. In liquid phase epitaxy the local growth rate of a portion of a particular layer will vary with the local curvature of the surface upon which it is grown. The greater the amount of local negative curvature of the surface, i.e., the greater the concavity of the surface when viewed from over the surface, the higher the local growth rate will be.

The substrate 18 is typically composed of an n-type group III-V alloy, preferably n-type GaAs, having a major surface 20 which is misoriented from a major crystallographic plane and which is substantially planar except for the grooves. Typically the surface is close to a member of the {100} family of planes with the axis of the grooves parallel to a <100> crystallographic direction. Use of a member of the <110> family of crystallographic axes is preferred since the end faces 14 of the semiconductor body are then cleavage planes. The misorientation is illustrated in FIG. 3 where a substrate has a pair of grooves therein parallel to the x-axis. The y-axis is in the plane of the substrate surface and perpendicular to the axis of the grooves and the z-axis is perpendicular to the substrate surface. The substrate surface is shown misoriented from the (001) crystallographic plane of an angle $\theta$ in the y-z plane, the x-axis and groove axis are parallel to the [110] crystallographic direction and the [110] crystallographic axis is misoriented from the y-axis by the angle $\theta$, again in the y-z plane. The angle $\theta$ of the misorientation of the substrate surface is preferably between about 0.5° and 3° in the y-z plane, i.e., perpendicular to the axis of the grooves. The substrate surface then differs slightly from a low surface-energy crystallographic plane, here a member of the {100} family of planes. Liquid phase epitaxy growth on this surface then occurs preferentially at an angle other than the normal to the surface in an attempt to reconstruct the lower energy {100} surface. In the absence of the grooves one or more randomly distributed terraces will form on the surface of the deposited layer. The grooves serve to initiate a predictable, regular array of usefully positioned terraces in the surface.

A terrace on a layer is that part of the layer having a transition from a first region which is a thicker portion of the layer to a second region which is a thinner portion of the layer. The transition region between the first and second regions is the terrace face. The portion of the first region adjacent to the terrace face is the terrace shoulder. The juncture of the terrace face and the surface of the second region forms a concave portion of the surface where the growth rate for a layer deposited thereon will be largest. Thus a layer deposited over a terraced surface will grow fastest in front of the terrace face, filling the concavity and causing the terrace in the growing to be laterally spaced from the terrace in the underlying layer. The location of a terrace in a particular layer depends upon the thickness of the layer and the location of the terrace in the underlying layer.

FIG. 3 shows the misorientation as having its direction parallel to the y-axis. The direction of the misorientation can, however, differ from the y-axis and lie in the x-y plane at an angle to the y-axis. We have found that the magnitudes of the terraces formed on the surface of the deposited layer decrease with increasing angle between the direction of the misorientation and the y-axis. Beyond an angle of ±20° in the x-y plane the terraces formed are small and their utility for inducing variations in the thickness of the deposited layers is reduced.

While substrate surface orientations close to the {100} family of planes are preferred, other families of crystallographic planes such as the {111B} family are also useful.

The grooves 24 are shown in FIG. 1 as having a dove-tail shape which results from the groove axis being parallel to the [110] crystallographic direction. Alternatively, the grooves 24 may have a different shape, for example, a U, V, or a rectangular shape which results when a different crystallographic axis is used as the groove axis or different chemical etchants are used. The grooves 24 are typically between about 4 and 20 micrometers ($\mu$m) wide at the surface 20, preferably about 10 $\mu$m wide, and have a depth of about 4 $\mu$m. The spacing of the grooves is typically between about 20 and 45 $\mu$m and is preferably about 32 $\mu$m. The grooves are formed using standard photolithographic and etching techniques as disclosed, for example, U.S. Pat. No. 4,215,319.

The height of the surface of the mesa 20a may be different than the height of the major surface 20 above the bottom of the grooves 24 as is disclosed by Botez in U.S. Pat. No. 4,426,701 and incorporated herein by reference. This difference in height increases the curvature of the layers deposited thereon. This difference in height is typically up to about 3 $\mu$m and is preferably between about 1 and 2 $\mu$m.

The buffer layer 26 is typically composed of the same material as the substrate 18 and is typically between about 1 and 3 $\mu$m thick over the mesa 20a. The thickness of this layer varies in the lateral direction due to the underlying grooves and is assymmetrical due to the misorientation.

The first confinement layer 30 is typically composed of n-type $Al_wGa_{1-w}As$ where the fractional concentration w of Al is between about 0.25 and about 0.4 and typically is about 0.3. This layer is typically between about 1 and 4 $\mu$m thick over the mesa and varies asymmetrically in thickness in the lateral direction. The guide layer 34, if present, is typically composed of n-type $Al_xGa_{1-x}As$ where the fractional concentration x of Al is less than that in the first confinement layer 30 and greater than that in the active layer 38 and is typically about 0.2. It is to be understood that while the guide layer 34 is described as underlying the active layer 38, it may, alternatively, overlie the active layer 38. The active layer 38 is composed of $Al_yGa_{1-y}As$, lightly doped either p- or n-type, where the fractional concentration y of Al is typically between about 0.0 and 0.1. The portion of maximum thickness 42 is over the concave portion of the surface 36 of the guide layer 34 adjacent to the face of the terrace 36a in the surface 36. Alternatively, if the guide layer 34 is not present, the portion of maximum thickness 42 overlies the concave portion of the terrace 32a of the surface 32 of the first confinement layer 30. The second confinement layer 44 is typically between about 1 and about 2 $\mu$m thick and is composed of p-type $Al_zGa_{1-z}As$ where the fractional concentration z of Al is between about 0.25 and 0.4 and is typically between about 0.3 and 0.35. The capping layer 46 is typically composed of p-type GaAs, is typically between about 0.2 and 1.5 $\mu$m thick and is preferably about 0.5 $\mu$m thick.

It is to be understood that other combinations of group III-V alloys may be used in the laser of the invention so long as the relationships of the bulk refractive indices of the individual layers are preserved.

In FIGS. 4(a) and (b) respectively, the lateral variation in the thickness of the active layer 38 and the guide layer 34 with distance from the shoulder 40 of the guide layer 34 is shown for semiconductor laser 10. The point of maximum thickness of the guide layer 34 is at the shoulder of the terrace 36a and tapers asymmetrically in thickness in the lateral direction from a maximum thickness of about 2.2 $\mu$m. The guide layer thickness may be between about 0.5 and 3.5 $\mu$m at this point. The portion of maximum thickness 42 of the active layer 38 is spaced laterally from the shoulder 40 since the maximum growth rate of the active layer 38 is over the concave portion of the terrace 36a. The active layer 38 has a thickness at this point of about 0.15 $\mu$m and asymmetrically tapers in decreasing thickness to about 0.1 $\mu$m. The maximum thickness of the active layer may be between about 0.05 and 0.3 $\mu$m.

The electrical isolation layer 48 is preferably composed of silicon dioxide deposited on the capping layer 46 by pyrolytic decomposition of a silicon containing gas, such as silane, in oxygen or water vapor. The opening 50 is formed using standard photolithographic and masking techniques and etching processes. Zinc is typically diffused into the portion of the capping layer exposed by the opening 50 a distance between about 0.1 and 0.2 $\mu$m. The first electrical contact is then deposited over the electrical isolation layer 48 and the capping layer 46 in the region of the opening 50 and is preferably composed of titanium, platinum and gold deposited by sequential vacuum evaporation. The substrate electrical contact 54 may be formed by vacuum deposition and sintering of a silver-tin eutectic alloy followed by sequential deposition of nickel and gold.

Alternatively, the electrical isolation layer 48 may be composed of a layer of the same material as, and having the opposite conductivity type to, that of the capping layer 46, thereby forming a p-n junction at the interface between these two layers. The p-n junction is reverse biased upon application of a forward bias voltage between the electrical contacts 52 and 54, thereby blocking the flow of current except through the opening 50.

The protective coating 62 is composed of aluminum oxide or a similar transparent material and has a thickness of about one-half wave at the wavelength of emitted light as disclosed by Ladany et al. in U.S. Pat. No. 4,178,564, incorporated herein by reference. The opposed end face 14 is coated with a reflector 64 as disclosed by Caplan et al. in U.S. Pat. No. 3,701,047 or by Ettenberg in U.S. Pat. No. 4,092,659, both of which are incorporated herein by reference.

Upon application of a forward bias voltage between the electrical contacts 52 and 54 electrical current will flow across the p-n junction region. If the current is greater than the lasing threshold value, the light generated upon recombination of the electrons and holes injected into the active layer will support laser action. Lasing action occurs in the portion of maximum thickness 42 of the active layer 38. Since the difference in the indices of refraction of the guide layer 34 and the active layer 38 is small, the light generated in the active layer progates in both the active and the guide layers.

Figure 5:
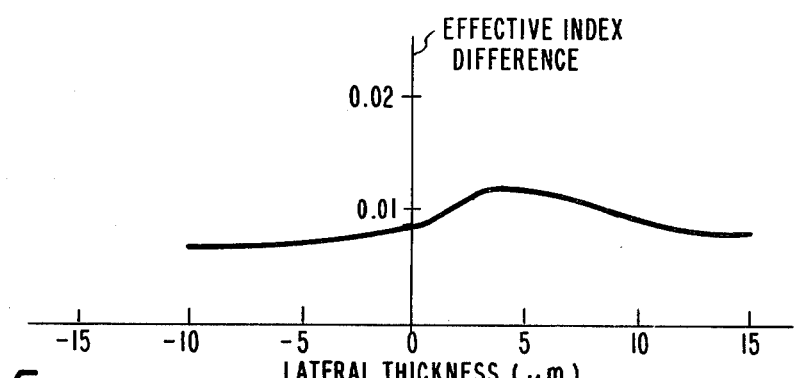
FIG. 5 is a graphical illustration of the effective index profile of the semiconductor laser.

Confinement of the propagating laser beam in the lateral direction is produced by the lateral thickness variation of the active and guide layers which can be translated into a lateral variation in an effective refractive index of the layers. The effective index refractive for a four layer structure, including the guide layer is:

$$N_{eff} \sim n_c + G_a(r)(n_a - n_c) + G_g(r)(n_g - n_c)$$

wherein $n_a$, $n_g$ and $n_c$ are the bulk refractive indices of the active, guide and confinement layers respectively, and $G_a(r)$ and $G_g(r)$ are the fractional portions of the optical mode amplitudes in the active and guide layers respectively as a function of a distance r in the lateral direction from the center point of the portion of maximum thickness 42 of the active 38. At the thickest portion of the active layer, the amplitude is predominantly in the active layer and the contribution to the refractive index variation due to the active layer thickness variation dominates. At a distance from the center point in the lateral direction, the active layer is thinner, a smaller fraction of the amplitude propagates in the active layer, a larger fraction propagates in the guide layer and the contribution to the refractive index variation due to the guide layer thickness variation begins to dominate. In FIG. 5 the effective refractive index as a function of distance in the lateral direction for a typical semiconductor laser 10 is shown. The effective refractive index is greatest in the portion of maximum thicknesses 42 of the active layer 38 and asymmetrically tapers to a decreasing value in the lateral direction thus forming a positive index guide. This positive index guide supports only the fundamental, or lowest order, mode of propagation of the laser beam.

EXAMPLE

A pair of dove-tail shaped grooves were chemically etched in the [110] direction into a polished n-type GaAs substrate which had been cut misoriented 1.0° off the (001) plane towards the [110] direction (i.e., the misorientation direction was perpendicular to the axis of the etched grooves). An additional etching step was then performed, using an $SiO_2$ mask that exposed only the top of the mesa, which lowered the surface of the mesa by about 1 $\mu$m with respect to the original surface. The layers of the device were then sequentially deposited by liquid phase epitaxy while cooling the substrate and melt between 850° C. and 800° C. at a 0.75° C. per minute cooling rate. A small degree of initial supercooling was used to prevent groove melt back. The deposited layers were an n+-type GaAs buffer layer, an n-type $Al_{0.31}Ga_{0.69}As$ first confinement layer, an n-type $Al_{0.21}Ga_{0.79}As$ guide layer, an undoped $Al_{0.06}Ga_{0.94}As$ active layer, a p-type $Al_{0.34}Ga_{0.66}As$ second confinement layer, and a p+-type GaAs capping layer. After the growth was completed, a $SiO_2$ isolation layer was deposited and a 10 $\mu$m wide contact stripe was formed over the lasing region. The electrical contacts were then formed in the manner described above.

Slivers were cleaved from this wafer and coated with an $Al_2O_3$ half wave protective coating on the emitting facet and a six layer dielectric stack reflector on the opposed end face. Individual dice were then cut from the slivers and mounted on headers for testing.

The cross-sectional structure of this laser was analyzed by angle lapping at a 5° angle and staining the surface thus exposed as disclosed by Olsen et al in the Journal of Applied Physics 45, 5112–5114 (1974). The thickness of the layers was then measured by optical microscopy. The guide layer had a maximum thickness of 2.2 $\mu$m and tapered laterally to 1.35 $\mu$m over 10 $\mu$m to one side and to 1.65 $\mu$m over 13 $\mu$m on the opposite side. The active layer had a maximum thickness of 0.15 $\mu$m over the concave portion of the terrace and tapered in decreasing thickness to about 0.1 $\mu$m at its shoulder.

CW lasing operation was obtained up to about 60 milliwatts at room temperature and up to about 15 milliwatts at a 70° C. ambient. The pulsed threshold current temperature coefficient $T_0$ was 190° C. in the −30°–20° C. temperature range and 105° C. over the 20°–50° C. temperature range. The lateral and transverse far field patterns of the output laser beam were stable up to 50 milliwatts output power with full-widths at half power of about 23° and 26° respectively at 20° C. About 70 percent of the operative devices exhibited single longitudinal, as well as lateral and transverse, mode operation up to about 50 milliwatts power output at 20° C.

We claim:

1. A semiconductor laser comprising a body of material having spaced parallel end faces, at least one of which is partially transparent so that the light may be emitted therefrom;
    said body comprising:
    a substrate having a pair of substantially parallel grooves in a major surface thereof which have a mesa therebetween and which extend between said end faces;
    a first confinement layer overlying said substrate surface, the surface of the grooves and the mesa and having a terraced surface with the terrace face extending between the end faces;
    an active layer, overlying the terraced surface of said first confinement layer and tapering in decreasing thickness from a portion thereof of maximum thickness which is over a concave portion of the terrace in the surface of the first confinement layer;
    a second confinement layer overlying the active layer; and
    electrical contacts to said substrate and a portion of said second confinement layer over the portion of maximum thickness of the active layer;
    the portion of maximum thickness of said active layer being the recombination region of the laser.

2. A semiconductor laser comprising a body of material having spaced, parallel end faces, at least one of which is partially transparent so that light may be emitted therefrom;
    said body comprising:
    a substrate having a pair of substantially parallel grooves in a major surface thereof which have a mesa therebetween and which extend between said end faces;
    a first confinement layer overlying said substrate surface, the surfaces of the grooves and the mesa and having a terraced surface with the terrace face extending between the end faces;
    a guide layer overlying the surface of the first confinement layer and having a terrace in the surface thereof which is laterally spaced from the terrace in the first confinement layer;
    an active layer overlying the terraced surface of said guide layer and tapering in decreasing thickness from a portion thereof of maximum thickness which is over a concave portion of the terrace in the surface of the guide layer;
    a second confinement layer overlying the active layer; and
    electrical contacts to said substrate and a portion of the second confinement layer over the portion of maximum thickness of the active layer;
    the portion of maximum thickness of said active layer being the recombination region of the laser.

3. The laser of claim 1 or 2 wherein said major surface of the substrate is substantially planar.

4. The laser of claim 1 or 2 wherein said major surface of the substrate is misoriented from a major crystallographic plane.

5. The laser of claim 4 wherein the major crystallographic plane is one of {100} family of planes and the axis of the grooves in the substrate is parallel to a <110> crystallographic direction.

6. The laser of claim 4 wherein the major crystallographic plane is a member of the {111B} family of planes and the axis of the grooves is parallel to a <110> crystallographic direction.

7. The laser of claim 4 wherein the misorientation of the major crystallographic plane relative to the surface substrate is between about 0.5° and 3°.

8. The laser of claim 7 wherein the direction of the misorientation of said surface is within about 20° of a direction perpendicular to the axis of the grooves.

9. The laser of claim 1 or 2 wherein a buffer layer is interposed between the substrate and the first confinement layer, a capping layer overlies the second confinement layer, an electrical isolation layer overlies the capping layer and has an opening extending therethrough over the portion of maximum thickness of the active layer, and the first electrical contact overlies said isolation layer and the surface of the capping layer in the region of the opening in said isolation layer.

10. The laser of claim 9 wherein the substrate and the buffer layer are composed of n-type GaAs, the first confinement layer is composed of an n-type AlGaAs alloy, the second confinement layer is composed of a p-type AlGaAs alloy and the capping layer is composed of p-type GaAs.

11. The laser of claim 10 wherein the partially transparent end face has a protective coating thereon and an opposed end face of the semiconductor body is coated with a reflector.

12. The laser of claim 1 or 2 wherein the height of the mesa above the bottom grooves differs from the height of the remainder of the major surface above the bottom of the grooves.

13. The laser of claim 12 wherein the difference in height between the surface of the mesa and the surface of the surrounding substrate is less than about 3 $\mu$m.

14. The laser of claim 1 or 2 wherein the grooves are dove-tail shaped.

15. The laser of claim 1 or 2 wherein the grooves are V-shaped.

16. The laser of claim 1 or 2 wherein the grooves are rectangularly shaped.

17. The laser of claim 1 or 2 wherein the grooves are U-shaped.

* * * * *

UNITED STATES PATENT AND TRADEMARK OFFICE
CERTIFICATE OF CORRECTION

PATENT NO. : 4,461,008

DATED : July 17, 1984

INVENTOR(S) : Connolly et al.

It is certified that error appears in the above-identified patent and that said Letters Patent is hereby corrected as shown below:

Column 1, line 32, before "of the laser", insert --layer--.
Column 1, line 32, after "The active" insert --layer--.
Column 3, line 32, "⟨100⟩" should be --⟨110⟩--.
Column 3, line 44, "[110]" should be --[$\bar{1}$10]--.
Column 4, line 4, after "growing" insert --layer--.
Column 6, line 40, "thicknesses" should be --thickness--.
Column 6, line 51, "[110]" should be --[$\bar{1}$10]--.

Signed and Sealed this

Second Day of October 1984

[SEAL]

Attest:

GERALD J. MOSSINGHOFF

Attesting Officer

Commissioner of Patents and Trademarks